United States Patent [19]

Grebene

[11] 3,902,140

[45] Aug. 26, 1975

[54] DIGITALLY CONTROLLED OSCILLATOR

[76] Inventor: Alan B. Grebene, 19095 Saratoga Glen Pl., Saratoga, Calif. 95070

[22] Filed: Oct. 18, 1972

[21] Appl. No.: 298,466

[52] U.S. Cl. ............ 331/113 R; 331/108 C; 332/14

[51] Int. Cl. ........................................... H03k 3/282

[58] Field of Search ........... 332/14; 331/113 R, 107, 331/179; 328/22

[56] References Cited

UNITED STATES PATENTS

| | | | |
|---|---|---|---|
| 3,350,575 | 10/1967 | Crouse | 328/22 |
| 3,510,803 | 5/1970 | Jacobson et al. | 332/14 |
| 3,582,809 | 6/1971 | Rigby | 331/8 |

*Primary Examiner*—John Kominski
*Attorney, Agent, or Firm*—Flehr, Hohbach, Test, Albritton & Herbert

[57] ABSTRACT

A digitally controlled oscillator includes an emitter coupled multivibrator with weighted current sources driving the timing capacitor of the multivibrator the weighted current sources being driven by a binary input signal to produce an output frequency corresponding to the binary weight of the input signal. The multivibrator produces output waveforms of either square, triangular or sine waveshapes. The sine wave output is accomplished by the use of anti-parallel diodes in conjunction with the triangular wave output circuitry.

1 Claim, 9 Drawing Figures

FIG. 2

DIGITALLY CONTROLLED OSCILLATOR

BACKGROUND OF THE INVENTION

The present invention is directed to a digitally controlled oscillator and more particularly to an oscillator which is responsive to a digital input signal for producing an output signal having a frequency related to the digital input signal.

Voltage controlled oscillators such as that shown in U.S. Pat. No. 3,582,809 entitled "Phase Locked Loop With Voltage Controlled Oscillator" in the name of Graham Rigby and assigned to the present assignee are often used as basic building block in a phase locked receiver or transmitter system, in frequency synthesizers, and in certain classes of analog to digital converters. However, because of the analog nature of their input control, the frequency of such oscillators is not easily shifted. Such shifting is especially important in a telemetry system where frequency multiplexing might be accomplished by the use of a digitally shifted carrier frequency.

From another aspect it is also desirable that an oscillator can produce various waveform types for various uses. Finally, it is desirable for an oscillator to be variable over a relatively large range with no cha nge, for example, in capacitor timing components.

OBJECTS AND SUMMARY OF THE INVENTION

Accordingly, it is a general object of this invention to provide a digitally controlled oscillator which is responsive to a digital input signal for producing an output signal having a frequency related to the digital input signal.

It is another object of the invention to provide an oscillator as above which has various output waveforms.

It is another object of the invention to provide an oscillator as above which has a wide frequency range.

In accordance with the above objects there is provided a digitally controlled oscillator responsive to a digital input signal for producing an output signal having a frequency related to the digital signal comprising a multivibrator having timing capacitor means, the charging and discharging of the capacitor means determining the frequency of oscillation of the output signal of the oscillator.

Current source means are coupled to the capacitor means for providing a current whose level determines the frequency of oscillation.

The current source means includes means for digitally varying the current level including a plurality of logic input terminals responsive to binary information carried by the digital input signal and a plurality of constant current sources coupled to the input terminals respectively and to the capacitor means and being selectively activated by a predetermined binary logic level applied to the corresponding input terminal to provide varying current levels to the capacitors means.

DETAILED DESCRIPTION OF THE PREFERRED EMBODIMENTS

Figure 1:
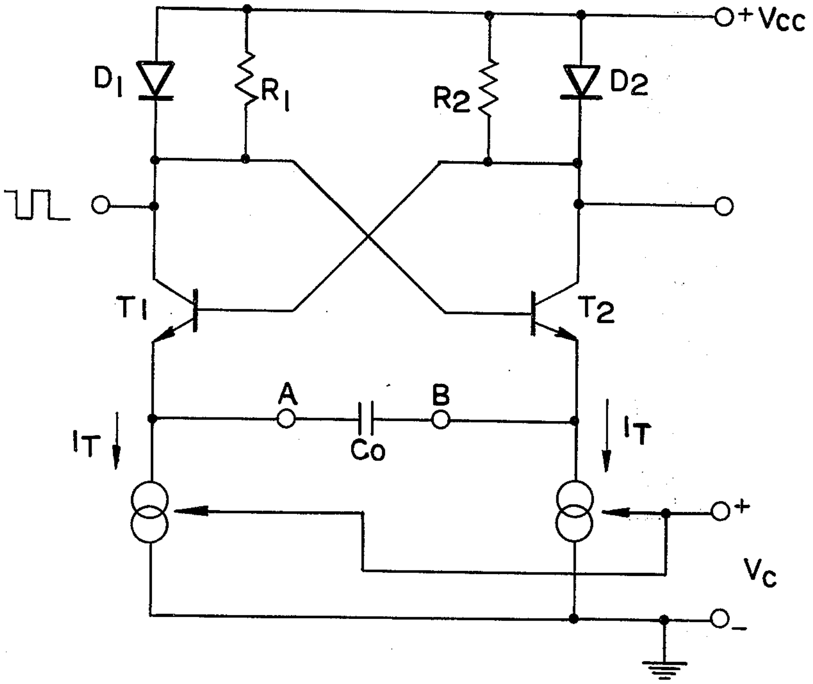
FIG. 1 PRIOR ART
FIG. 1 is a simplified circuit schematic of a prior art voltage controlled oscillator, for example, of the type shown in the Rigby patent.

The oscillator of FIG. 1 which is similar to that shown in the Rigby patent is basically an emitter coupled multivibrator circuit including transistors T1 and T2 with a timing capacitor $C_o$ coupled between the points A and B which correspond to the emitters of transistors T1 and T2 respectively. The diodes D1 and D2 in parallel with load resistors R1 and R2 limit the collector swing of transistors T1 and T2 and provide square wave outputs at the indicated terminals.

Current sources both designated as drawing currents $I_T$ on each side of capacitor $C_o$ provides for alternate charging and discharging of the timing capacitor so that the frequency of oscillation, $f_o$, can be expressed as an $$f_o = \frac{I_T}{4\, C_o\, V_{BE}} \qquad (1)$$

where $V_{BE}$ is the transistor base-emitter voltage. Since frequency is proportional to $I_T$ then control of $I_T$ by means of a control voltage, $V_c$, results in a linear voltage to frequency conversion characteristic.

Figure 2:
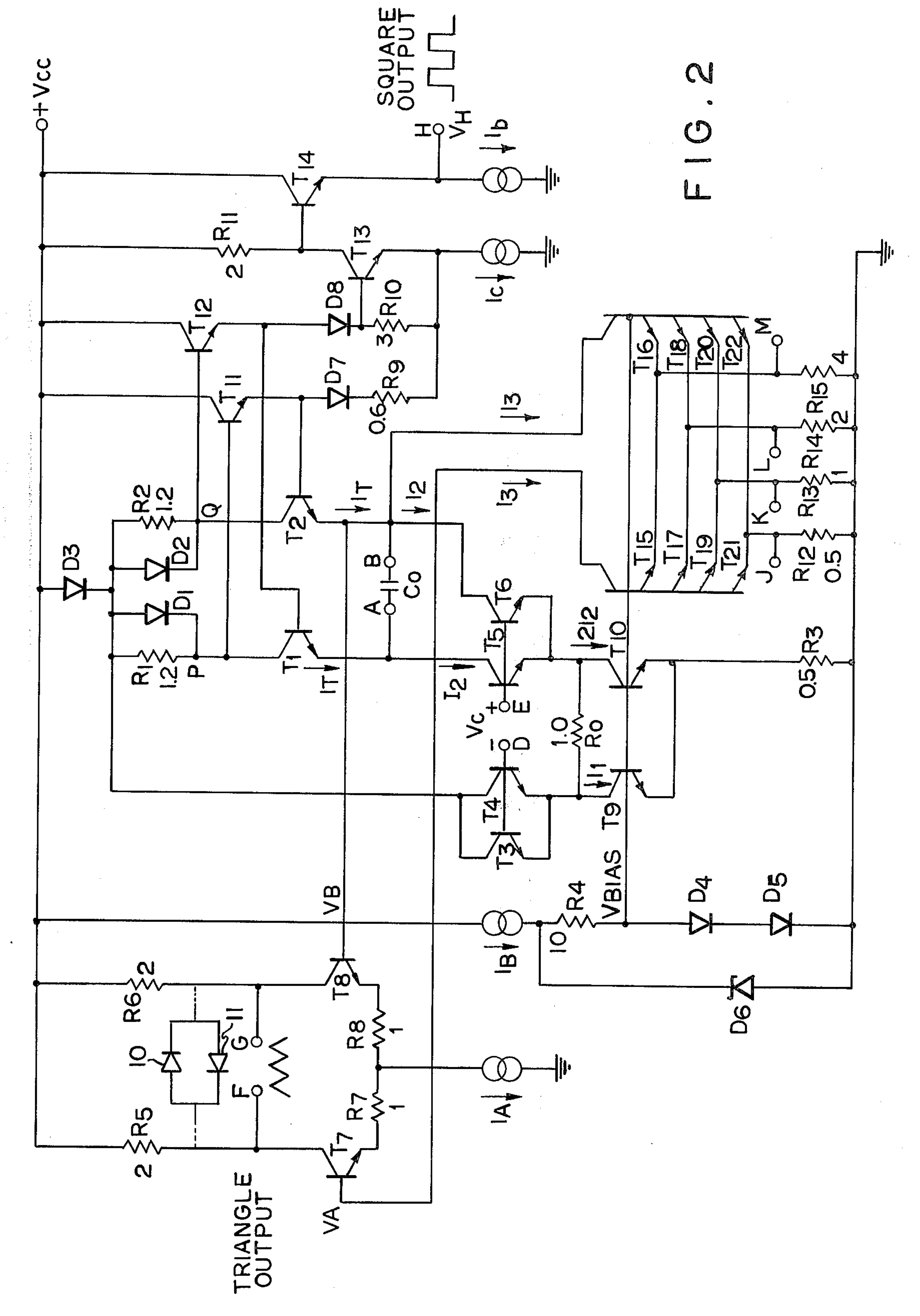
FIG. 2 is a detailed circuit schematic which is a modification and improvement over FIG. 1 embodying the oscillator of the present invention.

In accordance with the invention, the circuit of FIG. 2 illustrates how the oscillator of FIG. 1 may be digitally controlled or tuned. The total charging current, $I_T$, for the timing capacitor, $C_o$, is made up of two components $I_2$ and $I_3$. As will be discussed in detail below, these two currents are used to respectively provide analog and digital control of frequency.

As discussed in conjunction with FIG. 1 the analog control voltage, $V_c$, is applied differentially to terminals D and E and control the oscillator frequency by varying the value of $I_2$. Specifically, the analog control circuit includes a current source which consists of transistors T3 and T4 and a current source consisting of transistors T5 and T6. The current source T3, T4 provides a current $I_1$ which is twice the value of the currents, $I_2$, supplied by the source T5, T6. These currents, $I_1$, $I_2$, are respectively coupled to transistors T9 and T10. A resistor Ro between the emitters of the two current sources provides for emitter degeneration to assure dependence between the control voltage $V_c$ and $I_2$. Such differential control of current in response to an analog control signal is described and claimed in a copending application in the name of Alan B. Grebene entitled "Voltage Control Oscillator" filed Jan. 11, 1971 and bearing the Ser. No. 105,538 and assigned to the present Assignee.

Digital tuning of the oscillator is obtained by digital control of the current level $I_3$. This is accomplished by means of two sets of multi-emitter transistors T15 through T22 which operate as a 4 bit weighted current digital to analog converter. By proper scaling of the device geometries and the resistor values, R12–R15, the current through the various transistor pairs; namely, T21, T22, T19, T20, T17, T18 and T15; T16 are divided in a binary manner. These currents may be activated or switched on and off by applying logic inputs to the 4 binary input terminals J, K, L and M.

Figure 5:
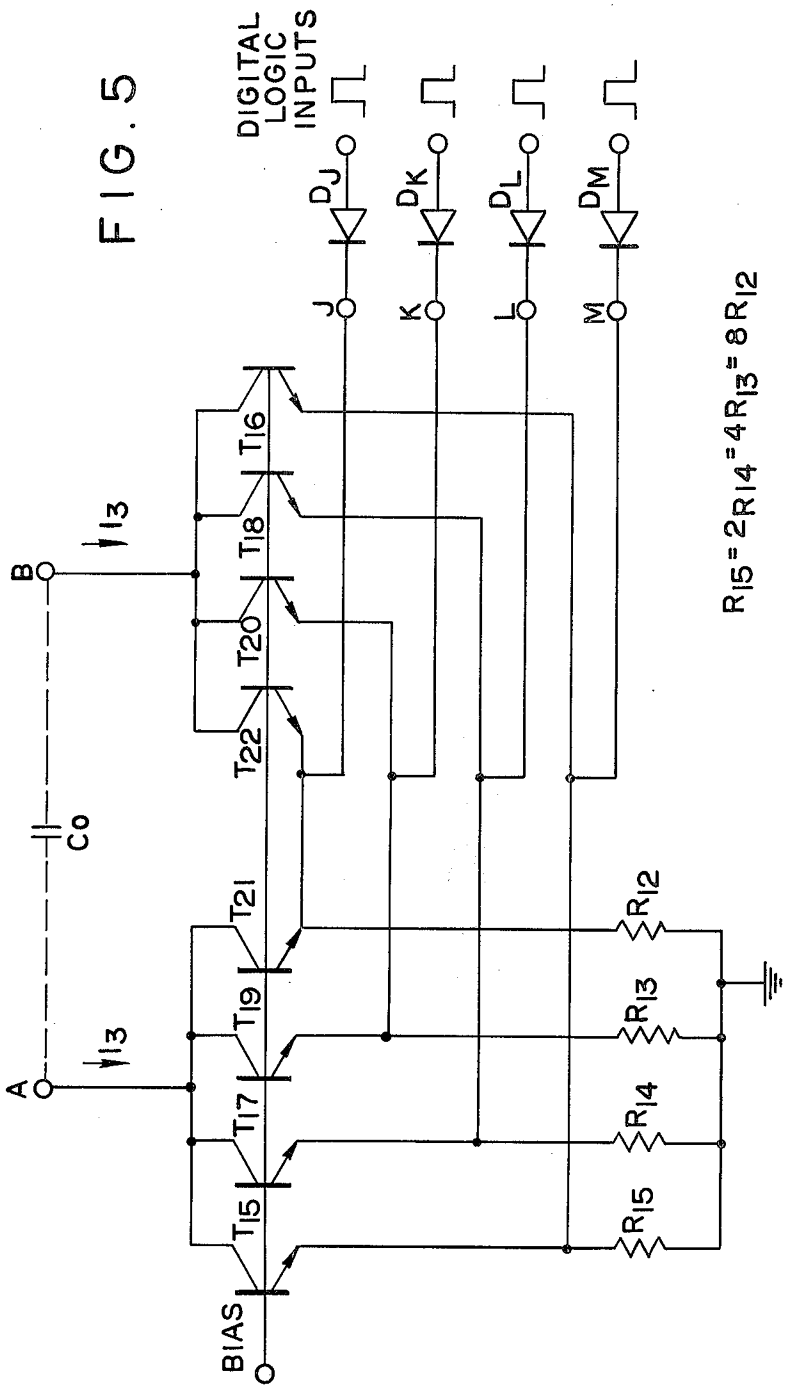
FIG. 5 is a more detailed circuit schematic of a portion of FIG. 2 useful in understanding its digital operation.

FIG. 5 illustrates more clearly the operation of the digital current generator where the digital logic inputs are all inputed through the isolation diodes DJ through DM. By means of the proper scaling of the resistors R12, R13, R14 and R15 the logic input directly corresponds to the magnitude of the current $I_3$. Specifically, the resistors are related by $$R15 = 2R14 = 4R13 = 8R12 \quad (2)$$

It is apparent that the positional weights of the 4 binary inputs signals are reflected by the resistors values which thus produce currents related to the weighted resistor values. In FIG. 2 all resistor values which are indicated are in kilohms.

The temperature dependence of the output frequency due to the base-emitter voltage variations indicated by the equation (1) is compensated by an external bias network comprised of the current source $I_B$, diodes D4, D5, D6 and resistor R4. This circuit provides a bias voltage, $V_{bias}$ to the transistors T9 and T10 of the analog current source and the transistors T15 through T22 of the digital current source. A similar biasing network is disclosed and claimed in the above mentioned Grebene application.

Referring to the remainder of the circuit of FIG. 2, the square wave output at terminal H, designated $V_H$, is obtained through an output buffer amplifier coupled to the bases and collectors of transistors T1 and T2. The buffer amplifier actually acts as a non-saturating Schmitt trigger circuit which includes transistors T11, T12, T13 and the current source $I_C$. This trigger circuit provides both positive feedback for the emitter-coupled multivibrator which includes transistors T1 and T2 and also converts the low level differential square wave at nodes P and Q to a high level single level output at node H.

Figure 3A:
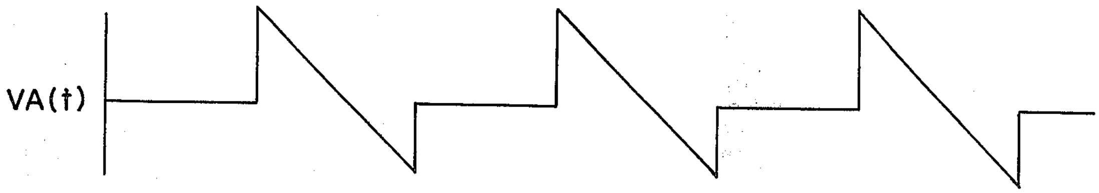
FIGS. 3A through 3D are waveforms useful in understanding the circuit of FIG. 2.
Figure 3B:
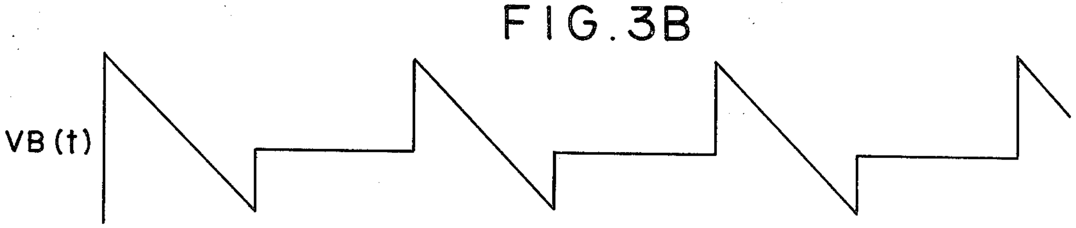
Figure 3C:
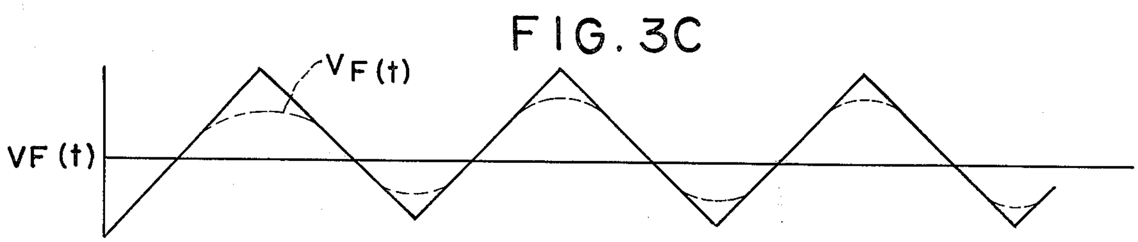
Figure 3D:
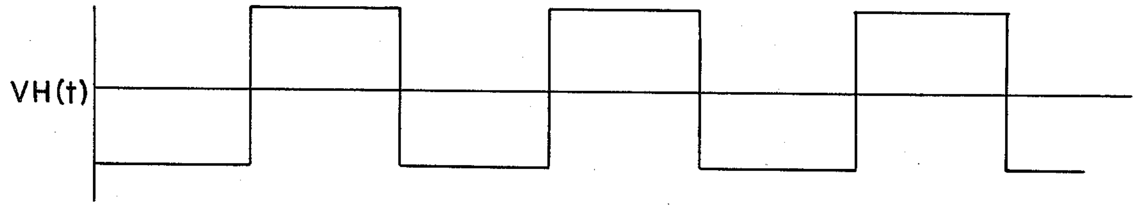

A triangular wave output is provided by taking the differential output signal across the points A and B designated with voltages $V_A$ and $V_B$ as illustrated in FIGS. 3A and 3B. The transistors T7 and T8 with their emitters tied together by resistors R7 and R8 and coupled to a current source $I_A$ provide such differential operation. The triangular waveform output thus produced across terminals F and G is shown in FIG. 3C. The square wave output waveform $V_H$ is illustrated in FIG. 3D.

In accordance with the invention, if a sine wave output is desired the triangular output voltage may be symmetrically limited to produce the waveform as illustrated in FIG. 3C as $V_F$. This is accomplished by a pair of anti-parallel diodes 10 and 11. When these are optionally coupled as illustrated between the collectors of T7 and T8 the output between the terminals F and G will be a sine wave, $V_F$, rather than the triangular output as illustrated. This is desirable in many applications.

Figure 4:
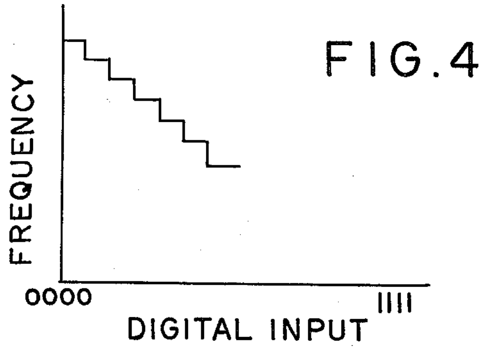
FIG. 4 is an operating characteristic of FIG. 2.

In operation, digital tuning is achieved by variation of current level $I_3$. Such variation is accomplished by a change in the binary input signal to the terminals J through M. The relationship of such variation with respect to the final output frequency is illustrated in FIG. 4 wherein the highest frequency occurs with none of the current sources activated and the lowest frequency with all of them activated in order to sink the maximum current $I_3$.

Figure 6:
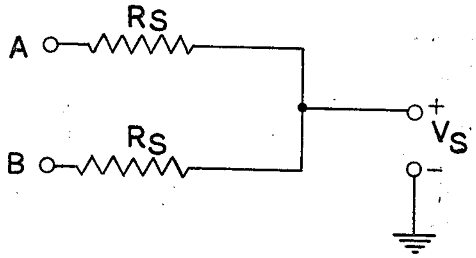
FIG. 6 is an alternative circuit which provides for a modification of the operation of the circuit of FIG. 2.

The oscillator frequency can also be varied over a broad sweep range by means of an analog sweep input voltage $V_s$ as illustrated in FIG. 6. This is accomplished by disabling all of the digital inputs J through M so that 13 is equal to zero and connecting the two equal resistors $R_s$ as shown in FIG. 6 across the terminals A and B. The frequency of oscillation varies linearly with a positive sweep voltage $V_s$ as given by $$f_0 = f_M - \frac{V_s}{R_s} \quad (3)$$

where $f_M$ is a maximum value of frequency corresponding to $V_s$ equal to 0.

The foregoing circuit because of its simplicity as well as the reduced number of total components readily lends itself to monolithic technology to produce the multi function waveform generator as described. In addition to a waveform generator it may serve the function as discussed above as an $f_M$ generator, a digital to frequency converter, or as the voltage controlled oscillator in a phase locked loop. Moreover, the output frequency can be made frequency stable or varied by analog or digital techniques as desired. The frequency range is set by the single external capacitor Co. In the circuit as shown, the oscillation frequency may be a varied from 1 Hertz to 30 MegaHertz.

I claim:

1. An analog and digitally controlled integrated circuit oscillator responsive to either a digital or analog input signal for producing an output signal having a frequency related to said input signal including a multivibrator having first and second transistors and timing capacitor means connected between said transistors, the charging and discharging of said capacitor means determining the frequency of oscillation of said output signal of said oscillator and including analog current source means responsive to said analog input signal to vary the amount of current produced by said current source means to vary said output signal the level of said current determining said frequency of oscillation, said analog current source means including three legs, two of the legs being coupled to said first and second transistors of said multivibrator and a third leg carrying the remainder of current of such source, said analog current source means also including means responsive to said analog input signal for varying the current in said two legs in an opposite sense relative to said variation of current in said third leg, wherein the improvement comprises: digital current source means for digitally varying said current level including a plurality of constant current source pairs each of said pairs producing a current level related to the relative positional weights of a digital binary input signal, each current source of one of said pair being connected to one of said two legs and similarly each current source of the other of said pair being connected to the other of said two legs said current source pairs being selectively activated by a predetermined binary logic level to provide varying current levels to said capacitor means; said analog current source including common current source means for receiving currents from said three legs and including at least one transistor and said current source pairs each including at least a pair of transistors and means for biasing all of such transistors of said common current source of said analog current source and said transistors of said current source pairs including a source of biasing voltage connected in common to all of such transistors.

* * * * *